US008059838B2

(12) United States Patent
Wu

(10) Patent No.: US 8,059,838 B2
(45) Date of Patent: Nov. 15, 2011

(54) INTERFACING CIRCUIT FOR A REMOVABLE MICROPHONE

(75) Inventor: Li-Te Wu, Taipei (TW)

(73) Assignee: Fortemedia, Inc., Cupertino, CA (US)

( * ) Notice: Subject to any disclaimer, the term of this patent is extended or adjusted under 35 U.S.C. 154(b) by 853 days.

(21) Appl. No.: 12/121,105

(22) Filed: May 15, 2008

(65) Prior Publication Data

US 2009/0285415 A1 Nov. 19, 2009

(51) Int. Cl.
*H04R 3/00* (2006.01)
*H03F 99/00* (2009.01)

(52) U.S. Cl. ......................... 381/113; 381/111; 381/120

(58) Field of Classification Search .................. 381/111, 381/113, 120
See application file for complete search history.

(56) References Cited

U.S. PATENT DOCUMENTS

2001/0053228 A1* 12/2001 Jones .......................... 381/71.6
2004/0208327 A1* 10/2004 Henson et al. ................ 381/113
2008/0298607 A1* 12/2008 Wu et al. ...................... 381/111

* cited by examiner

*Primary Examiner* — Luan C Thai
(74) *Attorney, Agent, or Firm* — Thomas|Kayden

(57) ABSTRACT

The invention provides an interfacing circuit for a removable microphone. In one embodiment, the interfacing circuit comprises a jack for receiving the removable microphone and an integrated circuit comprising a biasing circuit, a buffer amplifier, and an insertion detecting circuit. The jack comprises a first terminal receiving an output voltage of the removable microphone and a second terminal coupling the removable microphone to a ground voltage source. The integrated circuit is coupled to the first terminal of the jack via a first node. The biasing circuit, coupled between the first node and a second node, biases the removable microphone and passes only an alternative current (AC) portion of the output voltage of the removable microphone to the second node. The buffer amplifier, coupled to the second node, buffers the AC portion to generate a voltage signal. The insertion detecting circuit, coupled to the first node, generates an insertion signal indicating whether the removable microphone is inserted in the jack.

27 Claims, 7 Drawing Sheets

INTERFACING CIRCUIT FOR A REMOVABLE MICROPHONE

BACKGROUND OF THE INVENTION

1. Field of the Invention

The invention relates to microphones, and more particularly to microphone circuits.

2. Description of the Related Art

When audio processing devices are required to record audio signals, the audio processing devices need microphones for converting exterior sound pressures to electric signals. A microphone may be an optional removable component of an audio processing device and inserted to a jack of the audio processing device or removed from the jack of the audio processing device for a user's convenience. Thus, the audio processing device must comprise an interfacing circuit for detecting insertion of the removable microphone in the jack and biasing the removable microphone.

Referring to FIG. 1A, a block diagram of a conventional interface circuit 100 without a microphone plug inserted therein is shown. The interface circuit 100 comprises a jack 102, a resistor 106, a capacitor 108, and an integrated circuit 104. The jack 102 comprises terminals 112 and 116 and a metal sheet 114. The terminal 116 is coupled to a ground voltage source $V_{GND}$ via a node 136. The metal sheet 114 is coupled to a node 144 in the integrated circuit 104 via a node 134. The terminal 112 is coupled to a node 132. The resistor 106 has a resistance ranging between 2.2 kΩ and 4.7 kΩ and is coupled between a high voltage source $V_{DD}$ and the node 132, wherein a voltage of the high voltage source $V_{DD}$ ranges from 2V to 10V. The capacitor 108 has a capacitance ranging between 0.1 μF and 10 μF and is coupled between the node 132 and a node 142 in the integrated circuit 104.

The integrated circuit 105 comprises resistors 122, 124, and 126, an operational amplifier 128, and an analog-to-digital converter 130. The resistor 126 has a high resistance ranging between 200 kΩ and 2 MΩ and is coupled between a high voltage source $V_{DD}$ and the node 144. The resistor 122 is coupled between the node 142 and a negative input terminal of the operational amplifier 128. The resistor 124 is coupled between the negative input terminal of the operational amplifier 128 and an output terminal of the operational amplifier 128. A positive input terminal of the operational amplifier 128 is coupled to a reference voltage source $V_R$. The output terminal of the operational amplifier 128 is further coupled to an input terminal of the analog-to-digital converter 130.

The integrated circuit 104 detects a voltage of the node 144 to determine whether a microphone plug is inserted in the jack 102. When there is no microphone plug inserted in the jack 102 as shown in FIG. 1A, the voltage of the node 144 is at a high level $V_{DD}$. When there is a microphone plug inserted in the jack 102, the voltage of the node 144 is at a ground level $V_{GND}$. Referring to FIG. 1B, a block diagram of a conventional interface circuit 150 with a microphone plug 160 inserted therein is shown. The microphone plug 160 comprises a sleeve and a tip respectively coupled to one output terminal of an electret condenser microphone (ECM). When the microphone plug 160 is inserted in the jack 102, the terminal 116 of the jack 102 couples the sleeve of the microphone plug 160 to the ground voltage source $V_{GND}$. In addition, the sleeve 160 presses the metal sheet 114 of the jack 102 to couple the metal sheet 114 to the ground voltage source $V_{GND}$. The voltage of the node 144 is therefore lowered to the ground voltage $V_{GND}$ when the microphone plug 160 is inserted in the jack 102.

When the microphone plug 160 is inserted in the jack 102 as shown in FIG. 1B, the terminal 112 of the jack 102 couples the tip of the microphone plug 160 to the node 132. Because a terminal of an electret condenser microphone is coupled to the tip of the plug 160, the high voltage source $V_{DD}$ can therefore bias the electret condenser microphone via the tip of the plug 160. In addition, an AC portion of an output voltage of the electret condenser microphone passes through the capacitor 108 to the node 142. Because the resistors 122 and 124 and the operational amplifier 128 form an amplifier with an inverse configuration, the AC portion of the output voltage of the electret condenser microphone is then amplified by the operational amplifier 128 and delivered to the analog-to-digital converter 130 for analog-to-digital conversion.

The conventional interface circuit 100, however, has a few shortcomings. First, the metal sheet 114 increases the hardware cost of the jack 102. Additionally, the resistor 106 and the capacitor 108 are not integrated into the integrated circuit 104 and must be provided on a printed circuit board, increasing layout cost of the interfacing circuit 100. Moreover, the integrated circuit 104 must have two pins, increasing hardware cost of the integrated circuit 104, wherein a pin couples the node 142 to the capacitor 108 and a pin couples the node 144 to the node 134. Thus, an interfacing circuit for a microphone is therefore provided to reduce hardware cost.

BRIEF SUMMARY OF THE INVENTION

The invention provides an interfacing circuit for a removable microphone. In one embodiment, the interfacing circuit comprises a jack for receiving the removable microphone and an integrated circuit comprising a biasing circuit, a buffer amplifier, and an insertion detecting circuit. The jack comprises a first terminal receiving an output voltage of the removable microphone and a second terminal coupling the removable microphone to a ground voltage source. The integrated circuit is coupled to the first terminal of the jack via a first node. The biasing circuit, coupled between the first node and a second node, biases the removable microphone and passes only an alternative current (AC) portion of the output voltage of the removable microphone to the second node. The buffer amplifier, coupled to the second node, buffers the AC portion to generate a voltage signal. The insertion detecting circuit, coupled to the first node, generates an insertion signal indicating whether the removable microphone is inserted in the jack.

The invention provides an integrated circuit coupled to a jack receiving a removable microphone via a first node. In one embodiment, the integrated circuit comprises a first resistor, a first capacitor, a second resistor, a first operational amplifier, and a comparator. The first resistor is coupled between a first voltage source and the first node. The first capacitor is coupled between the first node and a second node. The second resistor is coupled between the second node and a second voltage source. The first operational amplifier has a positive input terminal coupled to the second node, and a negative input terminal coupled to an output terminal thereof. The comparator compares an output voltage at the first node with a reference voltage to generate an insertion signal.

The invention provides an integrated circuit coupled to a jack receiving a removable microphone via a first node. In one embodiment, the integrated circuit comprises a biasing circuit, a buffer amplifier, and an insertion detecting circuit. The biasing circuit, coupled between the first node and a second node, biases the removable microphone and passes only an alternative current (AC) portion of an output voltage of the removable microphone to the second node. The buffer amplifier, coupled to the second node, buffers the AC portion to generate a voltage signal. The insertion detecting circuit, coupled to the first node, generates an insertion signal indicating whether the removable microphone is inserted in the jack.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
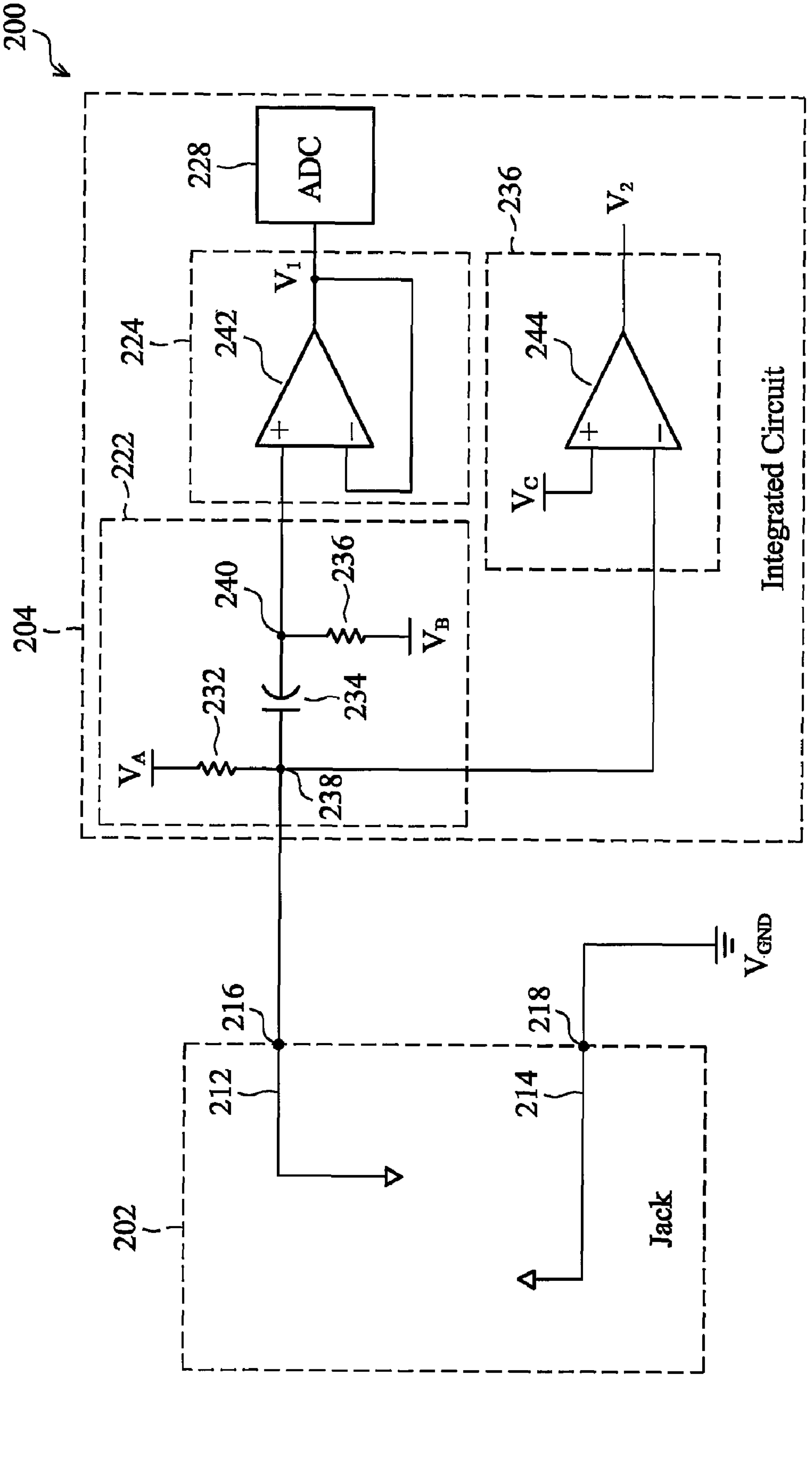
FIG. 2A is a block diagram of an interfacing circuit without a removable microphone inserted in a jack thereof according to the invention.

Referring to FIG. 2A, a block diagram of an interfacing circuit 200 without a removable microphone inserted therein according to the invention is shown. The interfacing circuit 200 comprises a jack 202 and an integrated circuit 204. The jack 202 is capable of receiving a plug of a removable microphone and comprises two terminals 212 and 214. The terminal 212 is coupled to a node 216 which is further coupled to a node 238 in the integrated circuit 204. The terminal 214 is coupled to a ground voltage source $V_{GND}$.

The integrated circuit 204 comprises a biasing circuit 222, a buffer amplifier 224, an insertion detecting circuit 236, and an analog-to-digital converter (ADC) 228. The biasing circuit 222 comprises a resistor 232, a capacitor 224, and a resistor 236. The resistor 232 is coupled between a high voltage source $V_A$ and the node 238 and has resistance ranging between 2.2 kΩ and 4.7 kΩ, wherein the voltage of the high voltage source $V_A$ ranges between 2V and 10V. The capacitor 224 is coupled between the node 238 and a node 240 and has capacitance ranging between 1 pF and 50 pF. The resistor 236 is coupled between the node 240 and a low voltage source $V_B$ and has resistance ranging between 0.5V and 3.3V.

The buffer amplifier 242 comprises an operational amplifier 242. The operational amplifier 242 has a positive input terminal coupled to the node 240 and a negative input terminal coupled to its output terminal. The operational amplifier 242 buffers a voltage at the node 240 to generate a voltage signal $V_1$ which is delivered to the analog-to-digital converter 228 as an input signal. The analog-to-digital converter 228 then converts the voltage signal $V_1$ from analog to digital. The insertion detecting circuit 236 comprises a comparator 244 compares a voltage at node 238 with a reference voltage $V_C$ to generate an insertion signal $V_2$. In one embodiment, the comparator 244 is an operational amplifier having a positive terminal coupled to the reference voltage source $V_C$ and a negative terminal coupled to the node 228. The voltage of the reference voltage source $V_C$ is less than that of the high voltage source $V_A$ by 0.3V.

When there is no microphone inserted in the jack 202, the voltage at the node 238 is equal to the voltage of the high voltage source $V_A$. Because the reference voltage source $V_C$ has a voltage less than that of the high voltage source $V_A$, the comparator 244 generates the insertion signal $V_2$ with a low level to indicate that there is no microphone inserted in the jack 202. When there is a microphone inserted in the jack 202, the voltage at the node 238 becomes lower than the voltage of the reference voltage source $V_C$, and the comparator 244 generates the insertion signal $V_2$ with a high level to indicate that there is a microphone inserted in the jack 202. The integrated circuit 236 can therefore determine whether a microphone is inserted in the jack 202 according to the voltage of the insertion signal $V_2$. Alteration of the voltage at the node 238 is further illustrated with FIG. 3A.

Figure 2B:
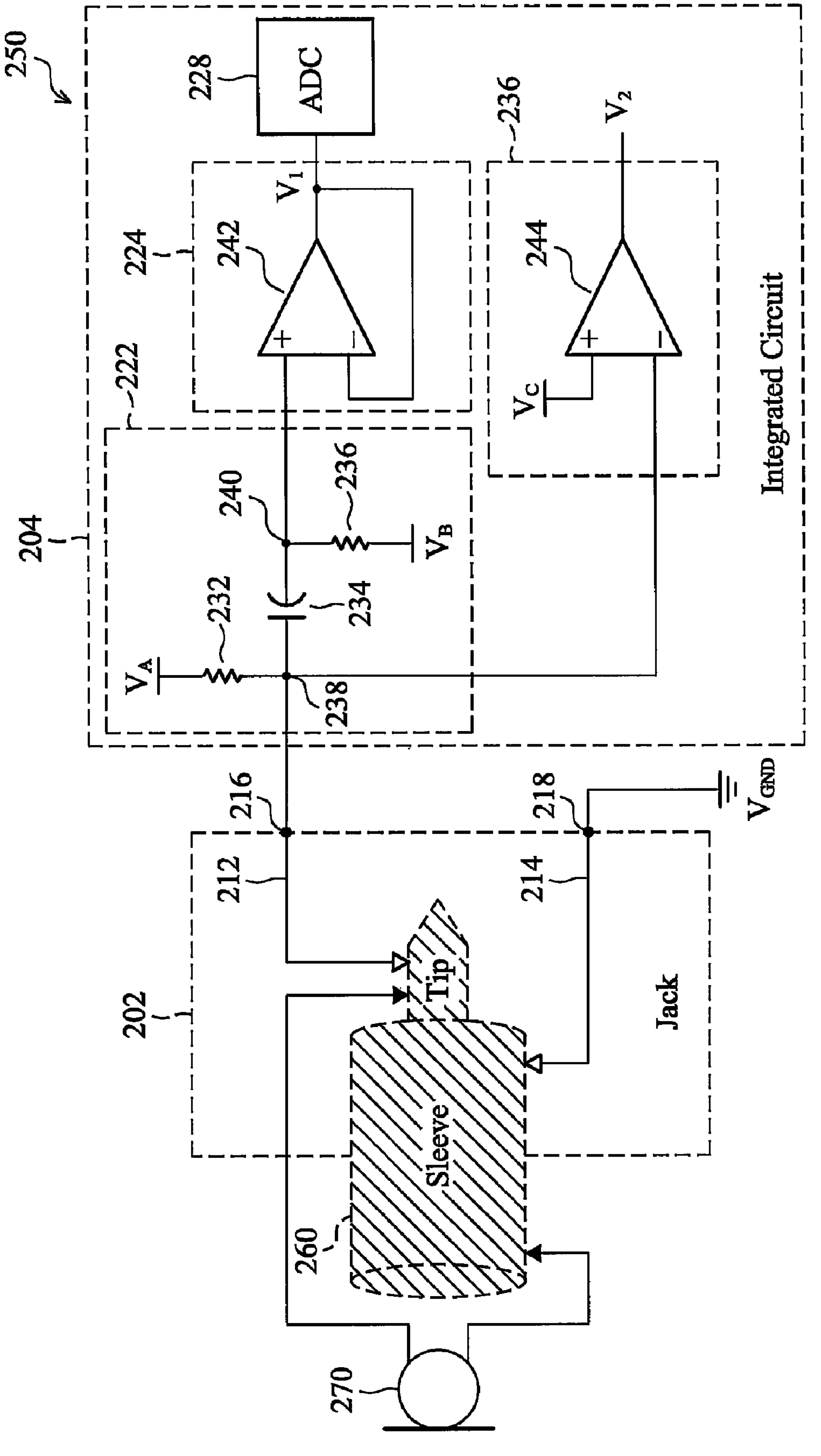
FIG. 2B is a block diagram of an interfacing circuit with a removable microphone inserted therein according to the invention.

Referring to FIG. 2B, a block diagram of an interfacing circuit 250 with a removable microphone 270 inserted therein according to the invention is shown. In one embodiment, the removable microphone 270 is an electret condenser microphone. The removable microphone 260 comprises a plug 260 for insertion into the jack 202. The microphone 270 converts sound pressure to a voltage signal and outputs the voltage signal as a voltage difference between two output terminals. One of the output terminals of the microphone 270 is coupled to a tip of the plug 260 and the other of the output terminals of the microphone 270 is coupled to a sleeve of the plug 260. When the plug 260 is inserted in the jack 202, the tip is coupled to the terminal 212 of the jack 202, and the sleeve is coupled to the terminal 214 of the jack 202. Because the terminal 212 is further coupled to the node 238, the high voltage source $V_A$ of the biasing circuit 222 can bias the electret condenser microphone 270 through the tip. Because the terminal 214 is further coupled to the ground, the voltage at the node 238 reflects the output voltage of the microphone 270.

Figure 3A:
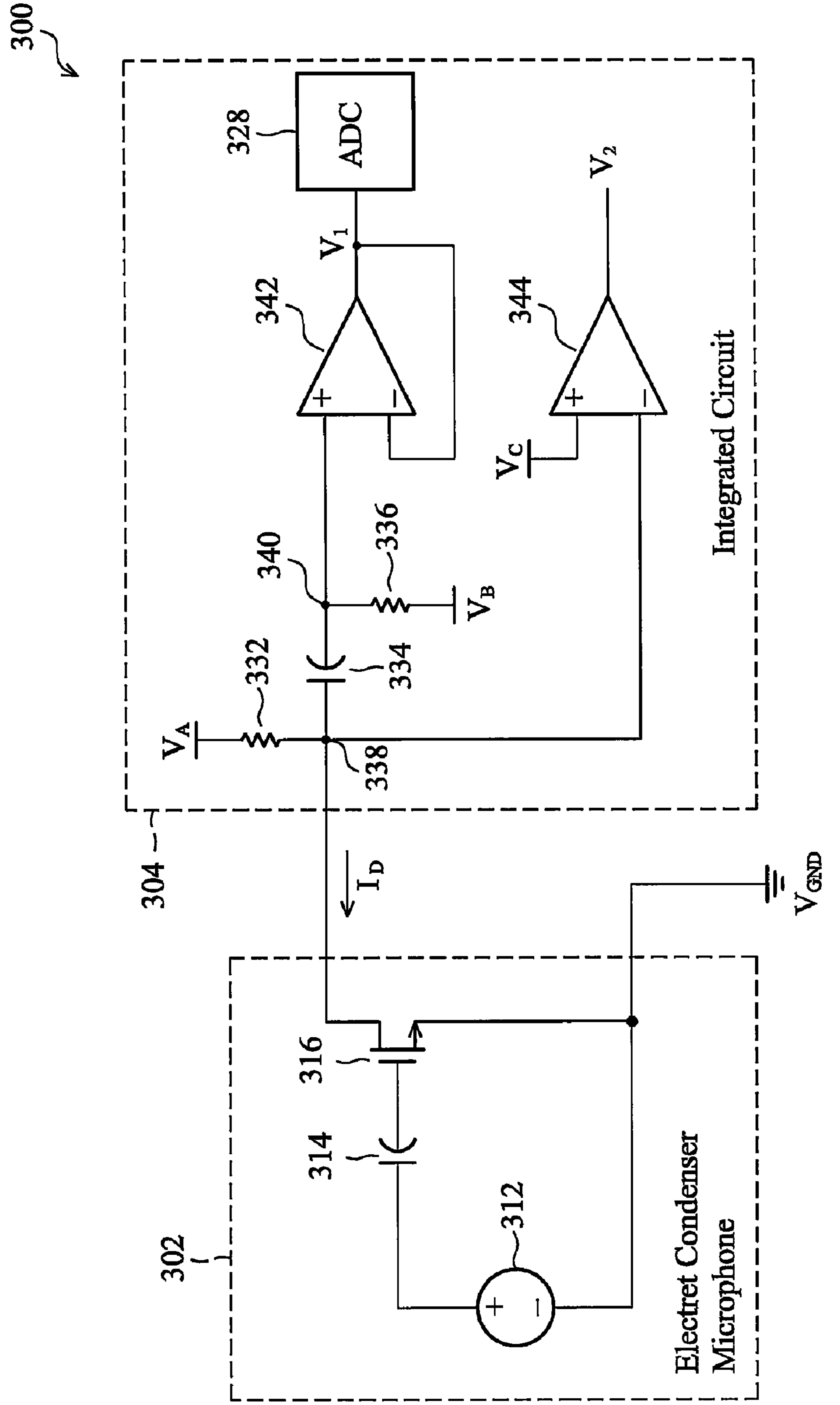
FIG. 3A is a circuit diagram of an interfacing circuit coupled to a microphone circuit according to the invention.

Referring to FIG. 3A, a circuit diagram of an interfacing circuit 300 coupled to a microphone circuit 302 according to the invention is shown. All circuit elements of the integrated circuit 304 in FIG. 3A have corresponding circuit elements in the integrated circuit 204 of FIG. 2B. The electret condenser microphone 270 of FIG. 2B is modeled as the microphone circuit 302 of FIG. 3A. The microphone circuit 302 comprises a transducer 312, a capacitor 314, and a transistor 316. The transducer 312 converts sound pressures to a voltage signal and has a sensitivity ranging between −36 and −48 dBV/Pa. The capacitor 314 has capacitance ranging between 5 pF and 10 pF and is coupled between the transducer 312 and a gate of the transistor 316. The transistor 316 is coupled between the ground voltage source $V_{GND}$ and the node 338.

The voltage across the transducer 312 is directly coupled to the gate of the transistor 316 and controls an amount of the drain current $I_D$ of the transistor 316. Because the drain current $I_D$ of the transistor 316 directly flow through the resistor 332, the drain current $I_D$ of the transistor 316 determines the voltage at the node 338. The voltage at the node 338 is therefore equal to ($V_A - R_{332} \times I_D$), wherein $R_{332}$ is resistance of the resistor 332 and ranges between 2.2 kΩ and 4.7 kΩ. Because the drain current $I_D$ ranges between 300 μA and 600

μA, the voltage at the node 338 is less than the voltage of the high voltage source $V_A$ by 0.66V~1.1V. Since the reference voltage source $V_C$ has a voltage less than that of the high voltage source $V_A$ by 0.3V, the voltage at the node 338 is lower than that of the reference voltage source $V_C$, and comparator 344 generates an insertion signal $V_2$ with a high level to indicate that the microphone 302 is coupled to the integrated circuit 304.

Figure 3B:
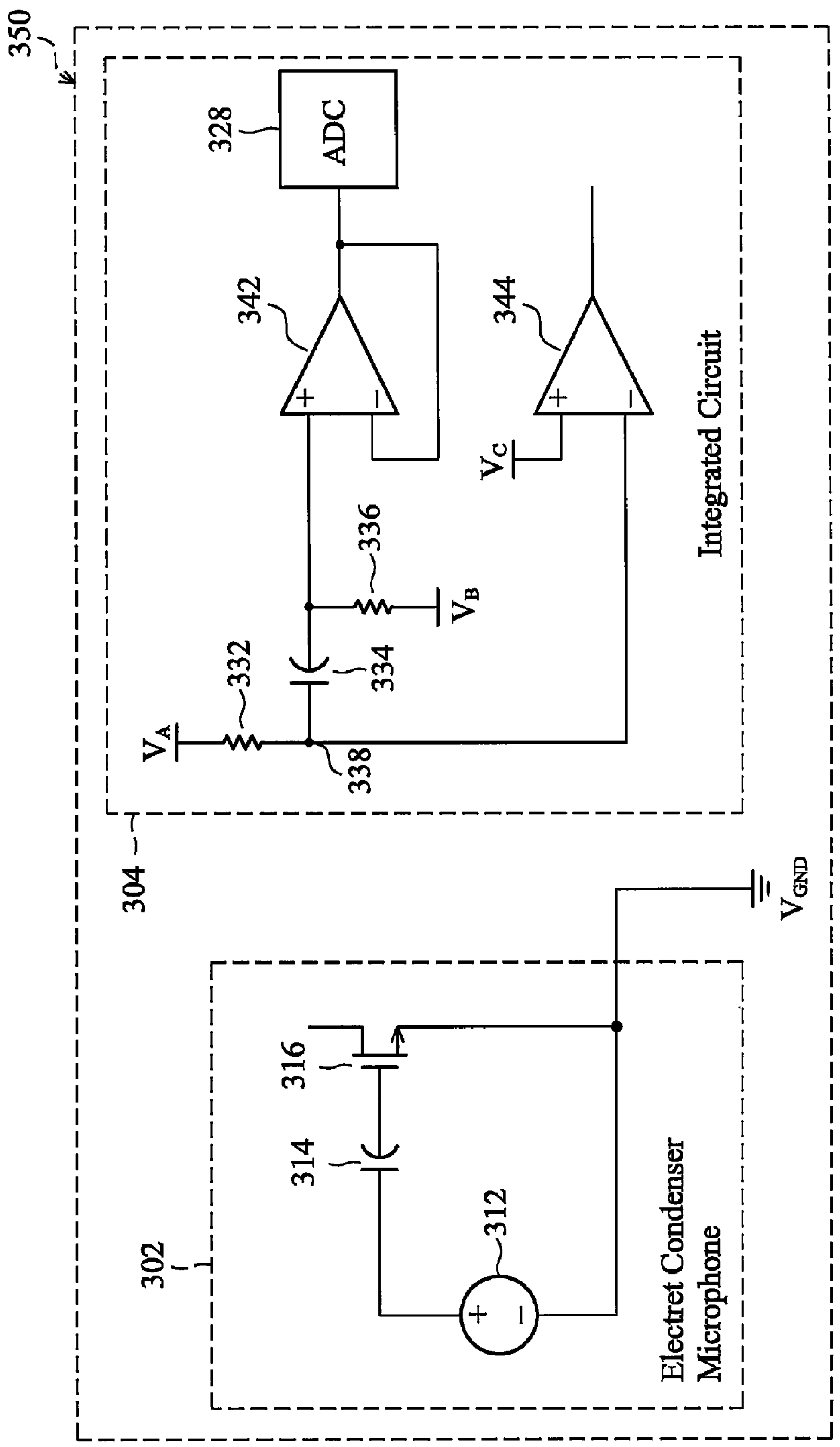
FIG. 3B is a circuit diagram of an interfacing circuit with an integrated circuit disconnected from a microphone circuit.

In addition, because the voltage across the transducer 312 reflects a sound pressure, and the drain current $I_D$ is proportional to the voltage across the transducer 312, when the drain current $I_D$ flows through the resistor 332, the voltage at the node 338 directly reflects the amount of the drain current $I_D$ and the sound pressure. The capacitor 334 then passes only the alternative current (AC) portion of the voltage at the node 338 to the node 340. The buffer amplifier 342 then buffers the voltage at the node 340 to generate the voltage signal $V_1$. Finally, the analog-to-digital converter 328 converts the voltage signal $V_1$ from analog to digital to obtain a digital signal reflecting the sound pressure detected by the transducer 312. FIG. 3B shows a circuit diagram of an interfacing circuit 350 with an integrated circuit 304 disconnected from a microphone circuit 302 for reference.

Figure 4:
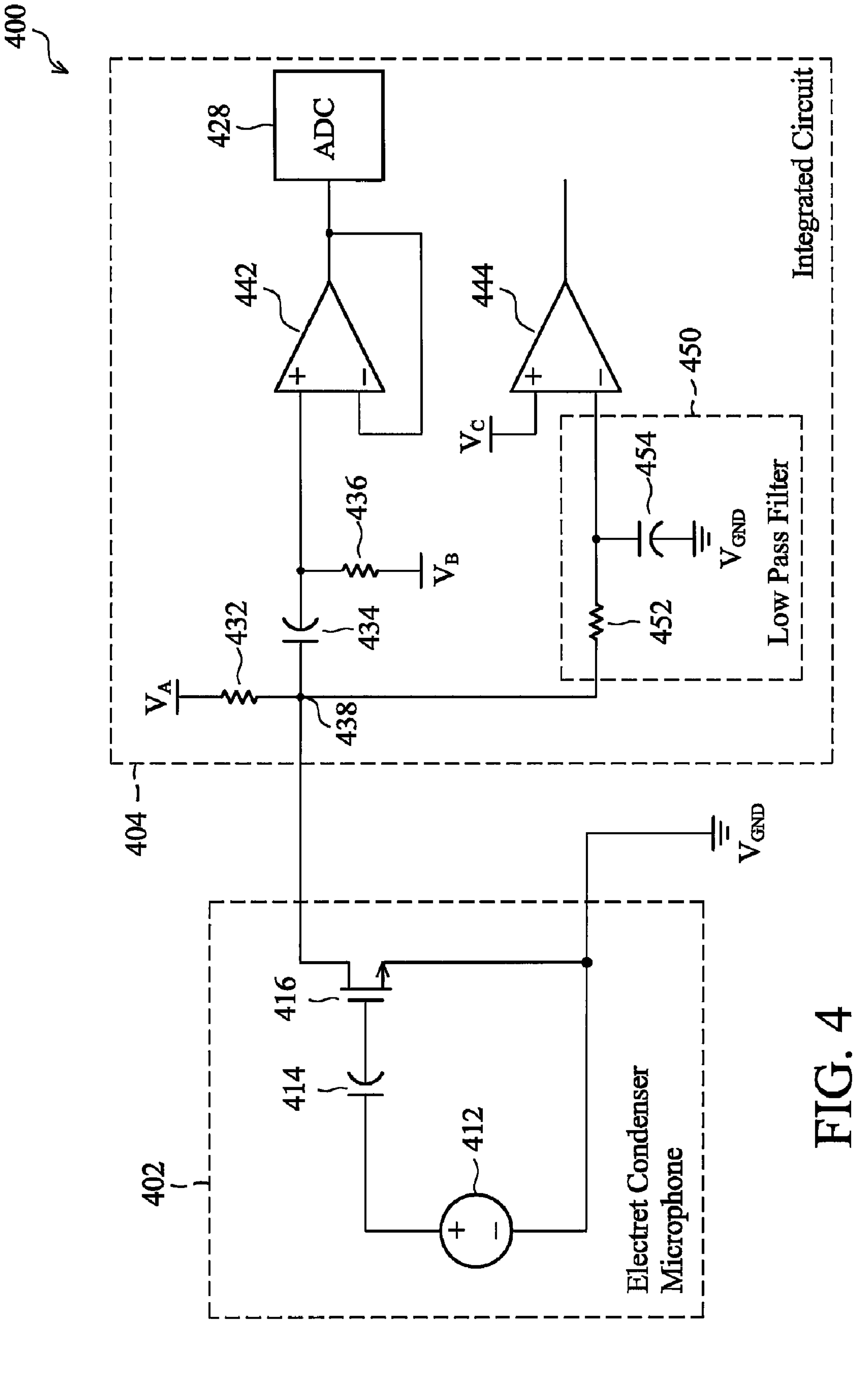
FIG. 4 is a circuit diagram of another embodiment of an interfacing circuit according to the invention.

Referring to FIG. 4, a circuit diagram of another embodiment of an interface circuit 400 according to the invention is shown. The integrated circuit 404 is roughly similar to the integrated circuit 304 except for a low pass filter 450 coupled between the node 438 and a negative input terminal of the comparator 444. In one embodiment, the low pass filter 450 comprises a resistor 452 and a capacitor 454. The resistor 452 is coupled between the node 438 and the negative input terminal of the comparator 444. The capacitor 454 is coupled between the negative input terminal of the comparator 444 and a ground voltage source $V_{GND}$. The low pass filter 450 filters the voltage at the node 438 with a cut-off frequency lower than 20 Hz, therefore avoiding malfunction due to incoming sound signals.

Figure 1A:
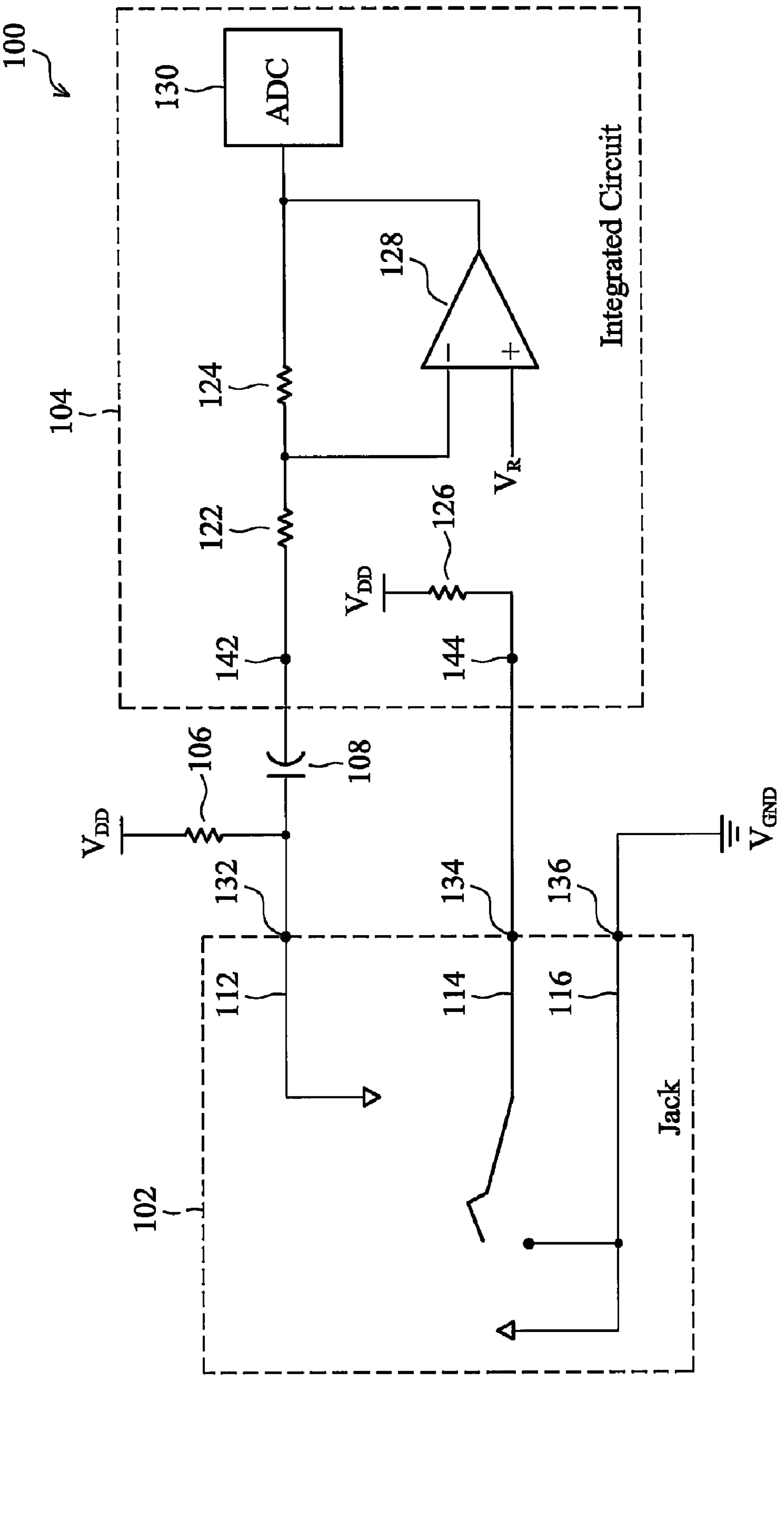
FIG. 1A ( PRIOR ART )
FIG. 1A is a block diagram of a conventional interface circuit without a microphone plug inserted therein.
Figure 1B:
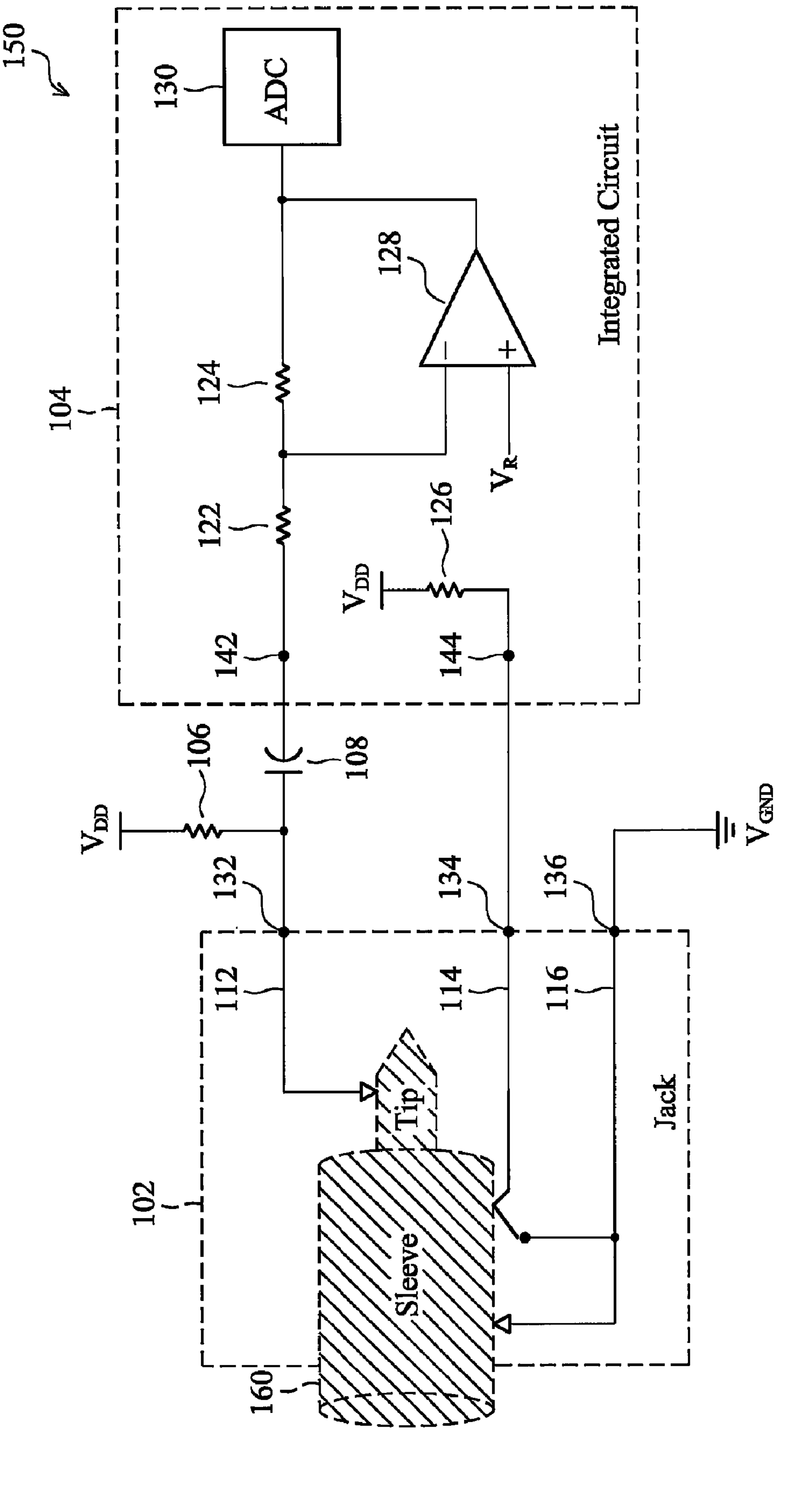
FIG. 1B ( PRIOR ART )
FIG. 1B is a block diagram of a conventional interface circuit with a microphone plug inserted therein.

Compared with the conventional interface circuit 100 shown in FIG. 1A, the hardware cost of the interface circuit 200 provided by the invention is greatly reduced. First, the jack 202 of the interface circuit 200 does not have an extra metal sheet 114 as the jack 102 shown in FIG. 1, and the cost of the jack 202 is therefore lower than that of the jack 102. In addition, the integrated circuit 204 requires only one pin coupled to the jack 202. The integrated circuit 104 shown in FIG. 1A, however, requires two pins coupled to the jack 102 and therefore has a higher cost than that of the integrated circuit 204. Moreover, the interface circuit 100 shown in FIG. 1 has two passive circuit elements, the resistor 106 and the capacitor 108, located on a printed circuit board. The interface circuit 200, however, has no such passive circuit elements located on a printed circuit board and has a lower hardware cost. Thus, the interface circuit 200 provided by the invention is superior to the conventional interface circuit 100.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An interfacing circuit for a removable microphone, comprising:
- a jack for receiving the removable microphone, comprising:
  - a first terminal, receiving an output voltage of the removable microphone; and
  - a second terminal, coupling the removable microphone to a ground voltage source; and
- an integrated circuit, coupled to the first terminal of the jack via a first node, comprising:
  - a biasing circuit, coupled between the first node and a second node, biasing the removable microphone, and passing only an alternative current (AC) portion of the output voltage of the removable microphone to the second node;
  - a buffer amplifier, coupled to the second node, buffering the alternative current (AC) portion to generate a voltage signal; and
  - an insertion detecting circuit, coupled to the first node, generating an insertion signal indicating whether the removable microphone is inserted in the jack.

2. The interfacing circuit as claimed in claim 1, wherein the removable microphone is inserted in the jack with a plug, the plug has a sleeve and a tip coupled to different output terminals of the removable microphone, and the tip and the sleeve are respectively coupled to the first terminal and the second terminal of the jack when the removable microphone is inserted in the jack.

3. The interfacing circuit as claimed in claim 1, wherein the biasing circuit comprises:
- a first resistor, coupled between a first voltage source and the first node;
- a first capacitor, coupled between the first node and the second node; and
- a second resistor, coupled between the second node and a second voltage source.

4. The interfacing circuit as claimed in claim 3, wherein resistance of the first resistor ranges between 2.2 kΩ and 4.7 kΩ, resistance of the second resistor ranges between 100 MΩ and 100 GΩ, capacitance of the first capacitor ranges between 1 pF and 50 pF, voltage of the first voltage source ranges between 2V and 10V, and voltage of the second voltage source ranges between 0.5V and 3.3V.

5. The interfacing circuit as claimed in claim 1, wherein the buffer amplifier comprises an operational amplifier, having a positive input terminal coupled to the second node, an output terminal generating the voltage signal, and a negative input terminal coupled to the output terminal.

6. The interfacing circuit as claimed in claim 3, wherein the insertion detecting circuit comprises a comparator comparing the output voltage at the first node with a reference voltage to generate the insertion signal, wherein the reference voltage is lower than the voltage of the first voltage source by 0.3V.

7. The interfacing circuit as claimed in claim 6, wherein the comparator is an operational amplifier with a positive input terminal coupled to the reference voltage and a negative input terminal coupled to the first node.

8. The interfacing circuit as claimed in claim 1, wherein the integrated circuit further comprises an analog-to-digital converter, coupled to the buffer amplifier, converting the voltage signal from analog to digital.

9. The interfacing circuit as claimed in claim 1, wherein the integrated circuit further comprises a low pass filter, coupled between the first node and the insertion detecting circuit, filtering the output voltage with a cut-off frequency lower than 20 Hz and delivering the filtered output voltage to the insertion detecting circuit.

10. The interfacing circuit as claimed in claim 9, wherein the low pass filter comprises:
- a third resistor, couple between the first node and the insertion detecting circuit; and a second capacitor, coupled between the insertion detecting circuit and the ground voltage source.

11. An integrated circuit, coupled to a jack receiving a removable microphone via a first node, comprising:

a biasing circuit, coupled between the first node and a second node, biasing the removable microphone, and passing only an alternative current (AC) portion of an output voltage of the removable microphone to the second node;

a buffer amplifier, coupled to the second node, buffering the alternative current (AC) portion to generate a voltage signal; and an insertion detecting circuit, coupled to the first node, generating an insertion signal indicating whether the removable microphone is inserted in the jack.

12. The integrated circuit as claimed in claim 11, wherein the removable microphone is inserted to the jack with a plug, the plug has a sleeve and a tip coupled to different output terminals of the removable microphone, and the jack comprises:

a first terminal, coupled to the tip of the plug, receiving the output voltage of the removable microphone and delivering the output voltage to the first node; and a second terminal, coupled to the sleeve of the plug, coupling the removable microphone to a ground voltage source.

13. The integrated circuit as claimed in claim 11, wherein the biasing circuit comprises:

a first resistor, coupled between a first voltage source and the first node;

a first capacitor, coupled between the first node and the second node; and a second resistor, coupled between the second node and a second voltage source.

14. The integrated circuit as claimed in claim 13, wherein resistance of the first resistor ranges between 2.2 kΩ and 4.7 kΩ, resistance of the second resistor ranges between 100 MΩ and 100 GΩ, capacitance of the first capacitor ranges between 1 pF and 50 pF, voltage of the first voltage source ranges between 2V and 10V, and voltage of the second voltage source ranges between 0.5V and 3.3V.

15. The integrated circuit as claimed in claim 11, wherein the buffer amplifier comprises an operational amplifier, having a positive input terminal coupled to the second node, an output terminal generating the voltage signal, and a negative input terminal coupled to the output terminal.

16. The integrated circuit as claimed in claim 13, wherein the insertion detecting circuit comprises a comparator comparing the output voltage at the first node with a reference voltage to generate the insertion signal, wherein the reference voltage is lower than the voltage of the first voltage source by 0.3V.

17. The integrated circuit as claimed in claim 16, wherein the comparator is an operational amplifier with a positive input terminal coupled to the reference voltage and a negative input terminal coupled to the first node.

18. The integrated circuit as claimed in claim 11, wherein the integrated circuit further comprises an analog-to-digital converter, coupled to the buffer amplifier, converting the voltage signal from analog to digital.

19. The integrated circuit as claimed in claim 11, wherein the integrated circuit further comprises a low pass filter, coupled between the first node and the insertion detecting circuit, filtering the output voltage with a cut-off frequency lower than 20 Hz and delivering the filtered output voltage to the insertion detecting circuit.

20. The integrated circuit as claimed in claim 19, wherein the low pass filter comprises:

a third resistor, couple between the first node and the insertion detecting circuit; and a second capacitor, coupled between the insertion detecting circuit and the ground voltage source.

21. An integrated circuit, coupled to a jack receiving a removable microphone via a first node, comprising:

a first resistor, coupled between a first voltage source and the first node;

a first capacitor, coupled between the first node and a second node;

a second resistor, coupled between the second node and a second voltage source;

a first operational amplifier, having a positive input terminal coupled to the second node, and a negative input terminal coupled to an output terminal thereof; and a comparator, comparing an output voltage at the first node with a reference voltage to generate an insertion signal.

22. The integrated circuit as claimed in claim 21, wherein the removable microphone is inserted in the jack with a plug, the plug has a sleeve and a tip coupled to different output terminals of the removable microphone, and the jack comprises:

a first terminal, coupled to the tip of the plug, receiving the output voltage of the removable microphone and delivering the output voltage to the first node; and a second terminal, coupled to the sleeve of the plug, coupling the removable microphone to a ground voltage source.

23. The integrated circuit as claimed in claim 21, wherein resistance of the first resistor ranges between 2.2 kΩ and 4.7 kΩ, resistance of the second resistor ranges between 100 MΩ and 100 GΩ, capacitance of the first capacitor ranges between 1 pF and 50 pF, voltage of the first voltage source ranges between 2V and 10V, and voltage of the second voltage source ranges between 0.5V and 3.3V.

24. The integrated circuit as claimed in claim 21, wherein the comparator is a second operational amplifier with a positive input terminal coupled to the reference voltage and a negative input terminal coupled to the first node, wherein the reference voltage is lower than the voltage of the first voltage source by 0.3V.

25. The integrated circuit as claimed in claim 21, wherein the integrated circuit further comprises an analog-to-digital converter, coupled to the output terminal of the first operational amplifier, converting an output voltage signal of the first operational amplifier from analog to digital.

26. The integrated circuit as claimed in claim 21, wherein the integrated circuit further comprises a low pass filter, coupled between the first node and the comparator, filtering the output voltage with a cut-off frequency lower than 20 Hz and delivering the filtered output voltage to the comparator.

27. The integrated circuit as claimed in claim 26, wherein the low pass filter comprises:

a third resistor, couple between the first node and the comparator; and a second capacitor, coupled between the comparator and a ground voltage source.

* * * * *